US007615455B2

(12) United States Patent
Chevalier et al.

(10) Patent No.: US 7,615,455 B2
(45) Date of Patent: Nov. 10, 2009

(54) INTEGRATED CIRCUIT BIPOLAR TRANSISTOR

(75) Inventors: Pascal Chevalier, Chapareillan (FR); Alain Chantre, Seyssins (FR)

(73) Assignee: STMicroelectronics S.A., Montrouge (FR)

( * ) Notice: Subject to any disclaimer, the term of this patent is extended or adjusted under 35 U.S.C. 154(b) by 217 days.

(21) Appl. No.: 11/523,770

(22) Filed: Sep. 19, 2006

(65) Prior Publication Data

US 2007/0063314 A1    Mar. 22, 2007

(30) Foreign Application Priority Data

Sep. 20, 2005   (FR) .................................. 05 52818

(51) Int. Cl.
*H01L 21/331* (2006.01)
*H01L 27/082* (2006.01)

(52) U.S. Cl. .................. 438/309; 438/318; 438/320; 438/337; 438/339; 438/360; 257/198; 257/588; 257/592; 257/593; 257/E21.371; 257/E21.379; 257/E29.193

(58) Field of Classification Search .............. 438/309, 438/318, 320, 339, 360; 257/588, 592, 593
See application file for complete search history.

(56) References Cited

U.S. PATENT DOCUMENTS

| 5,321,301 | A | * | 6/1994 | Sato et al. .................... 257/592 |
| 5,391,503 | A | | 2/1995 | Miwa et al. |
| 5,798,561 | A | * | 8/1998 | Sato ........................... 257/588 |
| 6,399,993 | B1 | | 6/2002 | Ohnishi et al. |

OTHER PUBLICATIONS

French Search Report from corresponding French Application No. 0552818, filed Sep. 20, 2005.
Chevalier, P. et al., 180 GHzft and fmax Self-Alligned SiGeC HBT Using Selective Epitaxial Growth of the Base, European Solid-State Device Research, 2003 33rd Conference on ESSDERC '03, Sep. 16-18, 2003, Piscataway, NJ, IEEE, Sep. 16, 2003, pp. 299-302, XP010676656.

\* cited by examiner

*Primary Examiner*—Dao H Nguyen
(74) *Attorney, Agent, or Firm*—Lisa K. Jorgenson; James H. Morris; Wolf, Greenfield & Sacks, P.C.

(57) ABSTRACT

A bipolar transistor having a base region resting by its lower surface on a collector region and surrounded with a first insulating layer, a base contact conductive region in contact with an external upper peripheral region of the base region, a second insulating region in contact with an intermediary upper peripheral region of the base region, an emitter region in contact with the central portion of the base region. The level of the central portion is higher than the level of the intermediary portion.

20 Claims, 3 Drawing Sheets

INTEGRATED CIRCUIT BIPOLAR TRANSISTOR

BACKGROUND OF THE INVENTION

1. Field of the Invention

The present invention relates to a method for manufacturing bipolar transistors compatible with a CMOS integrated circuit manufacturing process.

The present invention more specifically relates to high speed bipolar transistors which find applications in fields such as high bit rate optical communications, radio-frequency connections in the very-high frequency range, automobile anti-collision radars, etc. and associated devices.

2. Discussion of the Related Art

A detailed example of the forming of bipolar transistors in which, conventionally, a spacer is formed between the base forming and emitter forming steps, will be described in relation with FIGS. 1A to 1I.

The collector forming and collector contacting steps, which will be performed in any conventional fashion known by those skilled in the art, will not be described in detail.

In this method, as shown in FIG. 1A, it is started from a semiconductor substrate 1, generally made of silicon, on which are successively formed a layer of a first insulator 2, a polysilicon layer 3, and a layer of a second insulator 4. The substrate is a solid substrate or a thin semiconductor layer resting on a support, for example, a semiconductor of opposite type or an insulator.

As shown in FIG. 1B, a window is then opened in second insulator layer 4 and polysilicon layer 3 at the location where a bipolar transistor is desired to be formed. A second layer 5 of the second insulator is deposited on the structure.

At the step illustrated in FIG. 1C, the second insulator is etched to form spacers around the window edges. Thus, the second insulator completely surrounds polysilicon layer 3 with an upper layer 7 and a lateral layer 8.

At the step illustrated in FIG. 1D, first insulator layer 2 is etched, using layers 7, 8 as a mask, by overetching, so that the opening penetrates under spacer 8 and under an internal peripheral portion of polysilicon layer 3.

After this, as illustrated in FIG. 1E, a selective semiconductor material epitaxy is performed on silicon substrate 1. A base layer 10, exposed in the opening formed between spacers 8 and in contact by its periphery with polysilicon 3 which forms a base contact layer, thus forms.

At the steps illustrated in FIGS. 1F and 1G, second spacers are formed inside of the window by successively depositing a layer of a first insulator 12 and a layer of a second insulator 13, in the way illustrated in FIG. 1F, then by anisotropically etching second insulator 13 to obtain spacers 15 of the second insulator, as illustrated in FIG. 1G.

As illustrated in FIG. 1H, after the step illustrated in FIG. 1G, first insulator layer 12 is isotropically etched to obtain the configuration of spacers 15, 16. After this, a layer of a doped semiconductor 18 of a biasing type opposite to that of base 10 and forming an emitter region in portion 19 of contact with the base region is deposited.

Finally, in the steps illustrated in FIG. 1I, an etching is performed, as shown, to delimit the emitter region, and a siliconizing is performed to obtain silicide layers 21 on the base contact area and 22 on the emitter area.

The steps of forming of second spacer 15, 16 illustrated in relation with FIGS. 1F to 1H are generally used since the emitter area must be separated from the base contacting area to avoid any emitter-base short-circuit. However, the forming of such spacers adds manufacturing steps to a conventional CMOS component manufacturing process. Further, the applicant has noted that this step sequence, that is, the forming of spacers between the base forming and the emitter forming, results in a disadvantage which had perhaps not been sufficiently noted previously. Indeed, after the spacer forming steps, a thin native oxide layer inevitably forms on the surface of base layer 10 and cleaning processes must be carried out to form the emitter. The elimination of this oxide layer must be performed immediately before the step of forming semiconductor layer 18. Such steps are difficult to implement within the same frame and the applicant has established that, as a necessary result, there remains a little amount of native oxide, which adversely affects the transistor properties and the quality of the emitter-base junction. As a result, the obtained transistors do not have such high performances as would be desired.

European patent application N° 1117133 discloses a method wherein the upper portion of the intrinsic base layer is above the lower level of a spacer only in its portion in contact with the emitter. In the specific method disclosed in connection with FIG. 5B, an SiGe base layer 20 is epitaxied, then polysilicon layer 21 is grown. This application specifies at the beginning of paragraph [0058] that, between the depositions of the layers 20 and 21, a natural oxide film is formed on the surface of the SiGe layer 20.

SUMMARY OF THE INVENTION

The present invention aims at eliminating at least some of the defects of prior art bipolar transistors by providing a novel method for manufacturing such transistors.

Another object of the present invention lies in the obtained bipolar transistors.

To achieve these and other objects, the present invention provides a bipolar transistor comprising: a base region resting by its lower surface on a collector region and surrounded with a first insulating layer, a base contact conductive region in contact with an external upper peripheral region of the base region, a second spacer insulating region in contact with an intermediary upper peripheral region of the base region, an emitter region in contact with the central portion of the base region, wherein the upper level of the base region on both sides of its portion in contact with the spacer region is higher than the lower level of said spacer region.

According to an embodiment of the present invention, the base region is made of carbon-doped SiGe.

According to an embodiment of the present invention, the first insulating region is made of silicon oxide and the second insulating region is made of silicon oxynitride.

According to an embodiment of the present invention, the thicknesses of the various layers and the diameters of the useful regions are on the order of a few tens of nanometers.

The present invention also provides a method for manufacturing a bipolar transistor comprising the steps of: coating a semiconductor substrate, forming a collector, with a layer of a first insulator and with a polysilicon layer, opening the polysilicon layer, eliminating a surface portion of the first insulator layer, surrounding the polysilicon layer with a layer of a second insulator, the lateral portions of which form a spacer, the lower portion of which is under the upper level of the polysilicon layer, eliminating the portion of the first insulator layer located under the opening and beyond said opening by leaving in overhanging position a portion of the polysilicon layer, growing by selective epitaxy a base semiconductor layer so that the base layer rises partially back along a substantially vertical central portion of the second insulator layer, and depositing, in the same installation as that which has been used for the growth of the base semiconductor layer and while maintaining a vacuum, an emitter semiconductor layer.

According to an embodiment of the present invention, during the selective epitaxy step, silicon-germanium heavily doped according to the conductivity type of the base and also doped with carbon, then a little doped or undoped light silicon layer, are successively grown.

The foregoing and other objects, features, and advantages of the present invention will be discussed in detail in the following non-limiting description of specific embodiments in connection with the accompanying drawings.

DETAILED DESCRIPTION

Figure 1A:
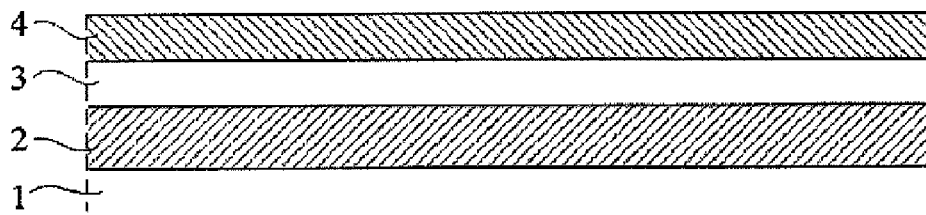
FIGS. 1A to 1I are partial cross-section views illustrating a prior art bipolar transistor manufacturing method.

For clarity, the same elements have been designated with the same reference numerals in the different drawings and, further, as usual in the representation of integrated circuits, the various drawings are not to scale.

According to an aspect of the present invention, a step sequence such that it is possible to successively perform, within the same frame and while maintaining a vacuum, the steps of local epitaxial growth of the base layer, and of growth of the semiconductor emitter layer, is selected.

FIGS. 2A to 2E illustrate an embodiment of the present invention.

The sandwich formed of first insulator 2, polysilicon 3, and second insulator 4 illustrated in FIG. 1A is first formed on a semiconductor substrate 1. Preferably, the substrate 1 is an N-type doped silicon substrate in which collector and subcollector areas may have been formed. According to a currently preferred embodiment of the present invention, first insulator 2 is silicon oxide, polysilicon semiconductor 3 is heavily-doped P-type polysilicon, and second insulator 7, 8 is silicon nitride or preferably an oxide and a silicon nitride.

Figure 1B:
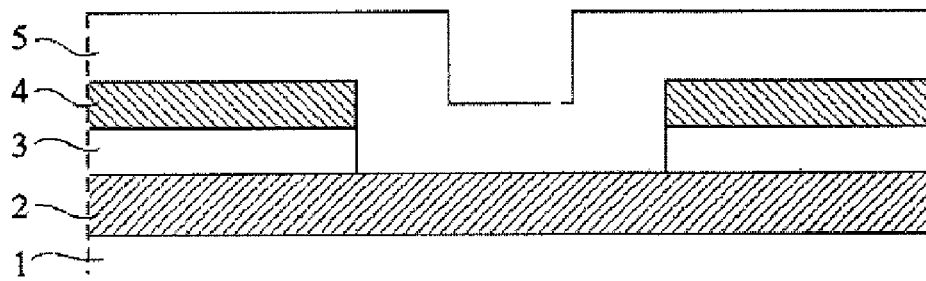
Figure 1C:
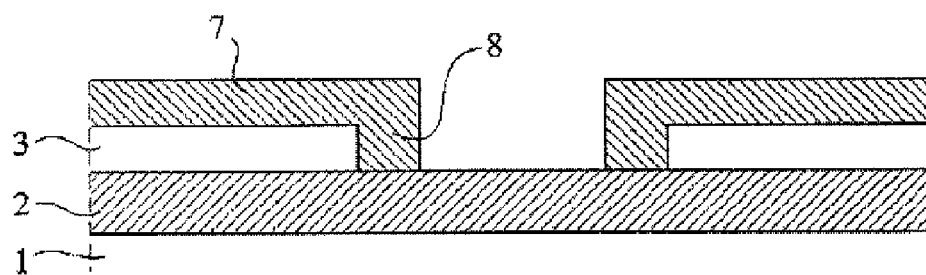
Figure 2A:
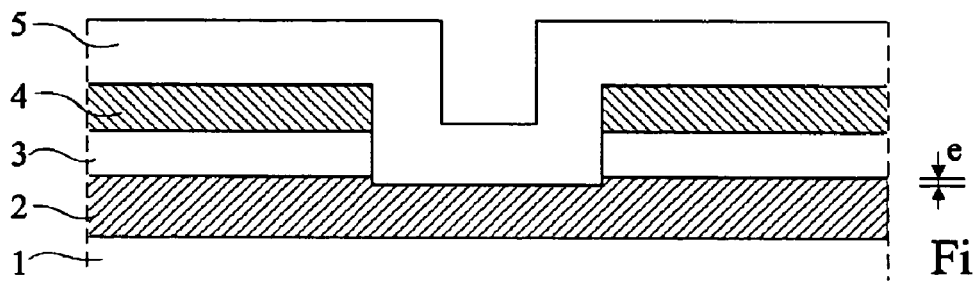
FIGS. 2A to 2E are partial cross-section views illustrating steps of the manufacturing of a bipolar transistor according to an embodiment of the present invention.

Then, as shown in FIG. 2A, and as described previously in relation with FIG. 1B, the layers of second insulator 4 and of polysilicon 3 are opened at the location where the emitter-base junction of a bipolar transistor is desired to be formed. However, as shown in FIG. 2A, this opening is formed to slightly dig into first insulator layer 2. Thus, second insulator layer 5 penetrates down to a depth "e" under the plane of the interface between first insulator layer 2 and polysilicon layer 3.

Figure 2B:
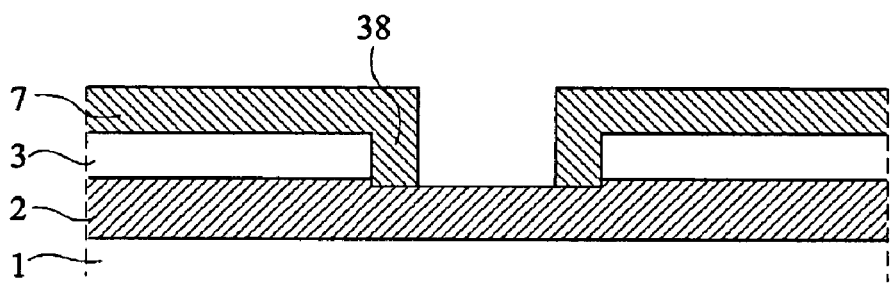

Thus, when the internal peripheral spacer 38 is formed, as shown in FIG. 2B, this spacer penetrates under the upper level of insulating layer 2.

Figure 1D:
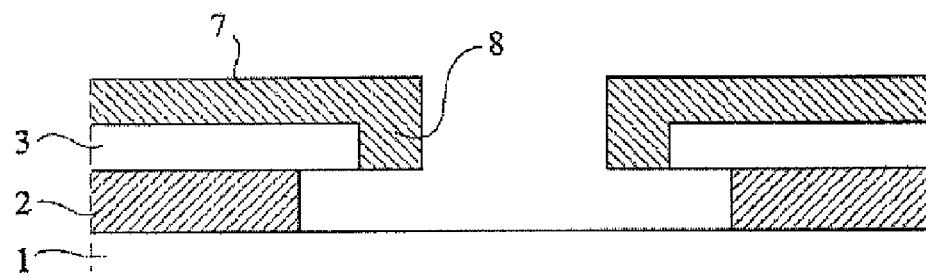
Figure 1E:
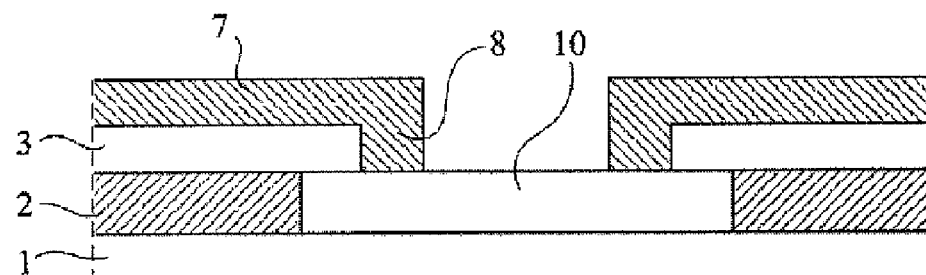
Figure 1F:
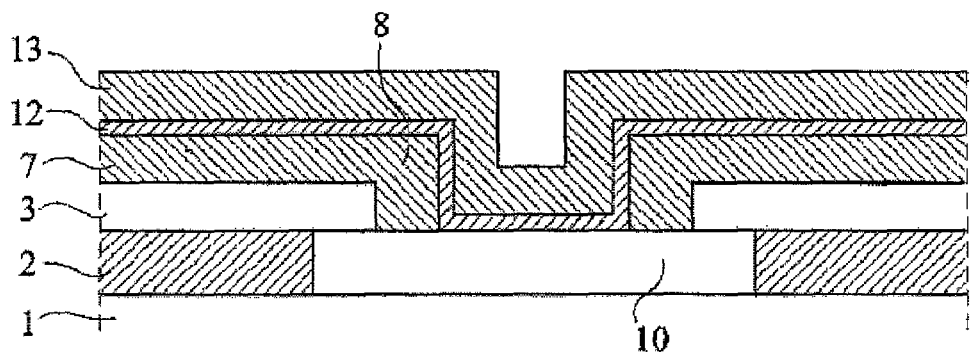
Figure 1G:
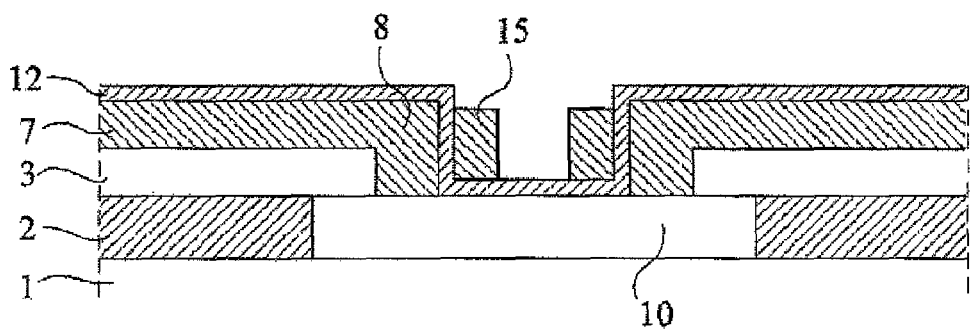
Figure 1H:
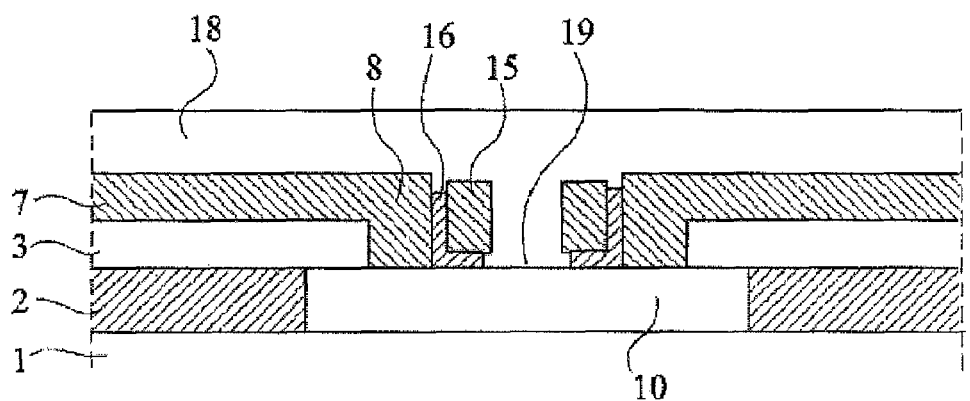
Figure 2C:
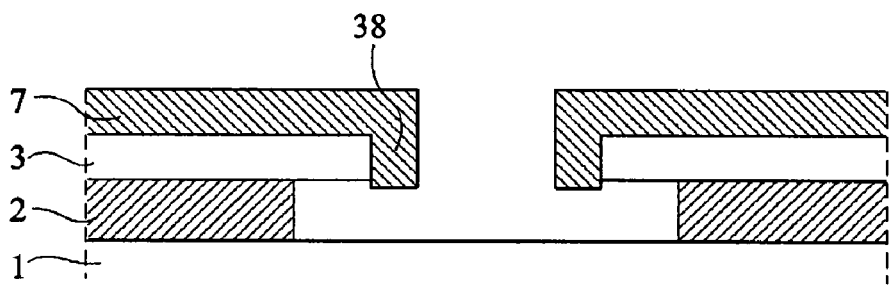

At the step of FIG. 2C the first insulator layer 2 is partially deleted, as previously disclosed in connection with FIG. 1D, by overetching, so that the opening penetrates under spacer 38 and under an internal peripheral portion of polysilicon layer 3.

Figure 2D:
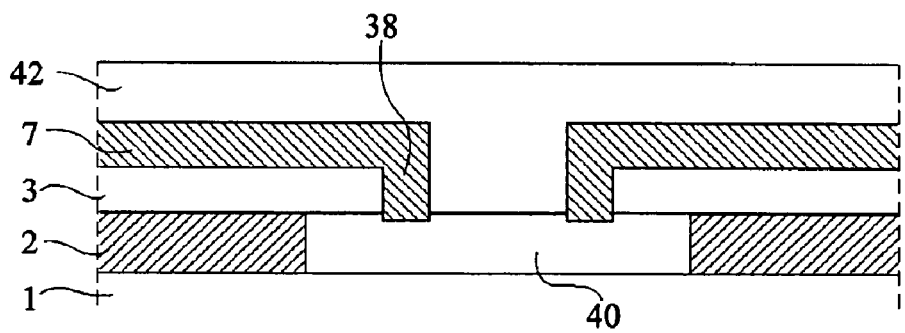

As shown in FIG. 2D, a base layer 40 is then formed by selective epitaxy on silicon substrate 1. The growth of the base layer is carried on so that it rises slightly above the plane of insulating layer 2. Then, the growth of emitter semiconductor layer 42 is immediately performed without coming out of the epitaxy enclosure and while maintaining a vacuum. No intermediary silicon oxide layer can thus be formed and the interface between emitter and base is devoid of any oxidized region. This provides particularly high-performance transistors. The base layer preferably is a carbon-doped silicon-germanium layer so that the interpenetration between the P dopants of the base and the N dopants of the emitter which will then be formed is decreased to a minimum. Also, preferably, a P-type doped SiGe layer containing carbon atoms is grown, and the epitaxy is carried on with a very thin layer (a few nm) of undoped silicon into which the N emitter dopants will penetrate.

Figure 1I:
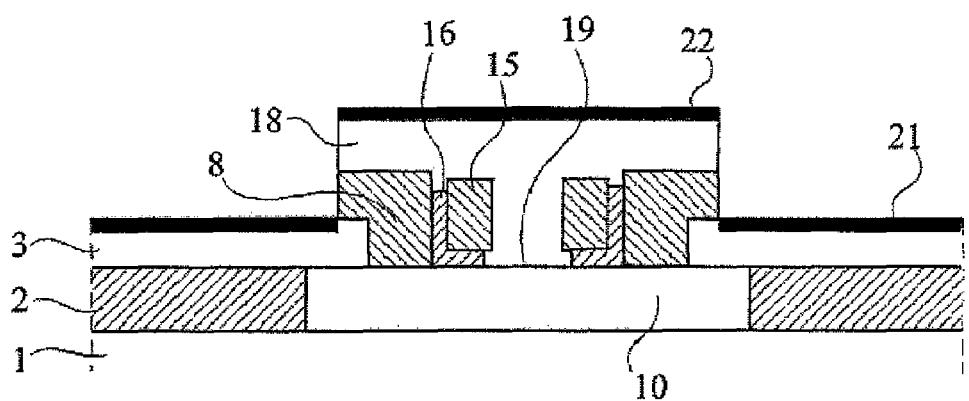
Figure 2E:
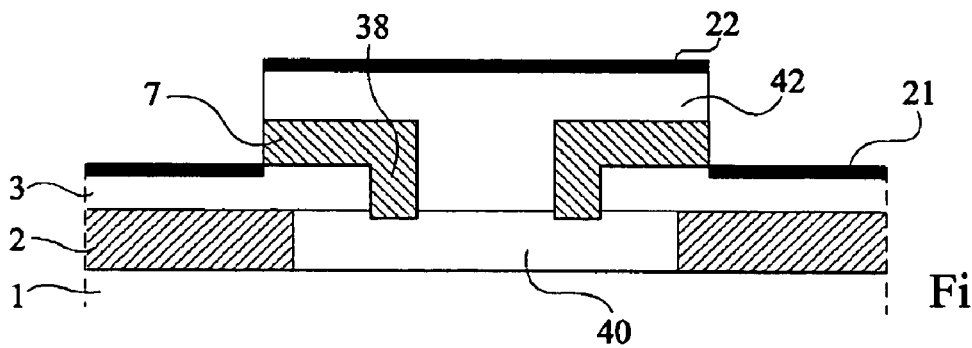

Emitter definition and siliciding steps illustrated in FIG. 2E are then performed to form layers designated by the same reference numerals as in FIG. 1I.

In an embodiment of the present invention, the dimensions are as follows:

thickness of pedestal oxide layer 2 on the order of from 20 to 30 nm, thickness of polysilicon layer 3 on the order of 50 nm (before siliconizing), thickness of second silicon oxynitride insulator layer 7 and of spacers 38 on the order of 50 nm, and total thickness of the emitter region on the order of 100 nm, and, thickness "e" of about 10 to 20 nm.

In the horizontal dimension, the base layer has at the level of the emitter-base junction a 100-nm width and extends by 100 nm on either side, that is, its peripheral contact with polysilicon layer 3 corresponds to a crown having a 50-nm width.

Thus, the insulation distance between the emitter junction and the base contact recovery layer is obtained due to the higher level of base layer 40 with respect to the lower portion of spacer 38 on both sides of the spacer.

Of course, the present invention is likely to have various alterations, modifications, and improvements which will readily occur to those skilled in the art. In particular, various materials have been indicated as an example only and it will be within the abilities of those skilled in the art to select other appropriate materials, for the insulators as well as for the semiconductors, a significant characteristic being the compatibility of these materials and in their mutually selective etch characteristics.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a bipolar transistor, the method comprising:

coating a semiconductor substrate that includes a collector region with a layer of a first insulator and with a polysilicon layer;

forming an opening extending through the polysilicon layer and extending only partially through the first insulator layer thereby eliminating at least a surface portion of the first insulator layer exposed by the opening;

surrounding exposed surfaces of the polysilicon layer with a layer of a second insulator after forming an opening extending through the polysilicon layer and extending only partially through the first insulator layer, the lateral portions of the second insulator layer in the opening forming a spacer that has a lower spacer surface that is deeper than a lower surface of the polysilicon layer;

eliminating a portion of the first insulator layer including the portion of the first insulator layer located beneath the opening and portions laterally beyond said opening thereby leaving in overhanging position a portion of the polysilicon layer;

growing by selective epitaxy a base semiconductor layer on the collector region so that the base layer rises partially back along a substantially vertical central portion beyond the lower spacer surface in the opening of the first insulator layer in an installation under vacuum after formation of the spacer having the lower spacer surface that is deeper than the lower surface of the polysilicon layer; and depositing an emitter semiconductor layer under vacuum in the same installation with the vacuum maintained between the growth of the base semiconductor layer and the deposition of the emitter semiconductor layer.

2. The method of claim 1, wherein growing by selective epitaxy a base semiconductor layer comprises:

growing a heavily carbon doped silicon-germanium layer; and growing a silicon layer that is at most lightly doped.

3. A method for manufacturing a bipolar transistor, the method comprising:

forming an opening extending through a polysilicon layer and extending only partially through a layer of a first insulator, thereby eliminating at least a surface portion of the layer of the first insulator, where the polysilicon layer at least partially overlays the layer of the first insulator that is on a substrate;

forming a layer of a second insulator that covers exposed surfaces of the polysilicon layer at least in the opening such that a lower surface of the second insulator layer is deeper than a lower surface of the polysilicon layer, after forming an opening extending through a polysilicon layer and extending only partially through a layer of a first insulator;

eliminating a portion of the layer of the first insulator located under the opening and eliminating adjacent portions of the layer of the first insulator such that portions of a bottom surface of the polysilicon layer are exposed, forming an open space in the layer of the first insulator;

growing a base semiconductor layer by selective epitaxy in the open space on the substrate such that the base layer within the opening extends higher than the lower surface of the layer of the second insulator, after forming a laser of a second insulator that covers exposed surfaces of the polysilicon layer at least in the opening such that a lower surface of the second insulator layer is deeper than a lower surface of the polysilicon layer; and depositing an emitter semiconductor layer, wherein no insulating elements are formed between commencing growing of the base semiconductor layer and commencing depositing the semiconductor layer, 4. The method of claim 3, further comprising:

depositing a first insulator layer on a semiconductor substrate; and depositing a polysilicon layer on the first insulator layer on the semiconductor substrate before forming the opening.

5. The method of claim 3, wherein the base semiconductor layer is grown under vacuum, the emitter semiconductor layer is deposited under vacuum, and the vacuum is maintained between the growth of the base semiconductor layer and the deposition of the emitter semiconductor layer.

6. The method of claim 3, wherein forming a layer of a second insulator tat covers exposed surfaces of the polysilicon layer comprises:

depositing a layer of a second insulator over the polysilicon layer and the opening; and etching the layer of the second insulator exposing an upper surface of the layer of the first insulator in the opening.

7. The method of claim 3, further comprising:

forming a first layer of a second insulator on the polysilicon layer before forming the opening; wherein forming the opening comprises forming the opening extending through the first layer of the second insulator, through the polysilicon layer and into the layer of the first insulator, and wherein the layer of the second insulator that covers exposed surfaces of the polysilicon layer is a second layer of the second insulator.

8. The method of claim 3, wherein a difference in depth between the lower surface of the second insulator layer and the lower surface of the polysilicon layer is between about 10 nm and about 20 nm.

9. The method of claim 3, wherein the lower surface of the second insulator layer is deeper than an upper surface of the layer of the first insulator.

10. The method of claim 3, wherein the base semiconductor layer comprises carbon-doped SiGe.

11. The method of claim 10, wherein the emitter layer comprises an N-doped semiconductor.

12. The method of claim 3, wherein depositing an emitter semiconductor layer comprises epitaxially growing an undoped silicon layer.

13. The method of claim 3, wherein a width of the base layer in the opening is about 100 nm.

14. The method of claim 3, wherein a lateral top surface of the base layer contacts the polysilicon layer over a region with a width of about 50 nm.

15. The method of claim 3, wherein the first insulator comprises silicon oxide.

16. The method of claim 3, wherein the layer of the first insulator has a thickness measuring between about 20 nm and about 30 nm.

17. The method of claim 3, wherein the second insulator comprises silicon oxynitride.

18. The method of claim 3, wherein the second insulator comprises silicon nitride.

19. The method of claim 3, wherein the layer of the second insulator is about 50 nm thick.

20. The method of claim 3, wherein the polysilicon layer comprises heavily doped P-type polysilicon.

* * * * *

UNITED STATES PATENT AND TRADEMARK OFFICE
CERTIFICATE OF CORRECTION

| | |
|---|---|
| PATENT NO. | : 7,615,455 B2 |
| APPLICATION NO. | : 11/523770 |
| DATED | : November 10, 2009 |
| INVENTOR(S) | : Pascal Chevalier et al. |

It is certified that error appears in the above-identified patent and that said Letters Patent is hereby corrected as shown below:

Claim 3, col. 5, line 46, should read:
of the layer of the second insulator, after forming a layer Claim 6, col. 6, line 10, should read:
second insulator that covers exposed surfaces of the polysili- Signed and Sealed this Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO.       : 7,615,455 B2
APPLICATION NO. : 11/523770
DATED            : November 10, 2009
INVENTOR(S)      : Chevalier et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 269 days.

Signed and Sealed this

Nineteenth Day of October, 2010

David J. Kappos
*Director of the United States Patent and Trademark Office*